(12) United States Patent
Huang

(10) Patent No.: US 9,313,909 B1
(45) Date of Patent: Apr. 12, 2016

(54) ALIGNMENT DEVICE OF A HARD DISK DRIVE BAY

(71) Applicant: Jui-Shu Huang, Taoyuan County (TW)

(72) Inventor: Jui-Shu Huang, Taoyuan County (TW)

(*) Notice: Subject to any disclaimer, the term of this patent is extended or adjusted under 35 U.S.C. 154(b) by 0 days.

(21) Appl. No.: 14/536,604

(22) Filed: Nov. 8, 2014

(51) Int. Cl.
*H05K 5/02* (2006.01)
*G11B 33/02* (2006.01)
*H05K 5/03* (2006.01)

(52) U.S. Cl.
CPC .............. *H05K 5/0256* (2013.01); *G11B 33/02* (2013.01); *H05K 5/0239* (2013.01); *H05K 5/03* (2013.01)

(58) Field of Classification Search
CPC ......... H05K 7/14; H05K 7/1487; H05K 7/18; H05K 7/10; H05K 5/00; H05K 7/1452; H05K 5/0239; H05K 5/03; H05K 5/0256; G06F 1/16; G06F 1/187; G06F 1/181; G11B 33/122; G11B 33/02
USPC ............. 361/679.31–679.39, 679.01–679.61, 361/679.55–679.59, 724–727, 752, 754, 361/755, 756, 759, 788; 312/223.1–223.2
See application file for complete search history.

(56) References Cited

U.S. PATENT DOCUMENTS 8,369,080 B2 * 2/2013 Huang .................... G06F 1/187
361/679.37

* cited by examiner

*Primary Examiner* — Anthony Haughton
*Assistant Examiner* — Ingrid Wright
(74) *Attorney, Agent, or Firm* — Tracy M. Heims; Apex Juris, pllc.

(57) ABSTRACT

An alignment device of a hard disk drive (HDD) bay has a casing, at least one door, and at least one alignment mechanism. The at least one door is mounted on a front sidewall of the casing. The at least one alignment mechanism is mounted on a rear sidewall of the casing. Each of the at least one alignment mechanism has a stationary seat, and an aligning panel and a torsion spring pivotally mounted on the stationary seat. The torsion spring pushes the aligning panel to pivot toward a lateral sidewall of the casing. When inserting an HDD into the casing and the HDD abuts against the aligning panel, the aligning panel pushes the HDD to slide laterally and align with the connector on the rear sidewall of the casing. Thus, pins on a rear end of the HDD can accurately plug into corresponding holes of the connector.

8 Claims, 5 Drawing Sheets

ALIGNMENT DEVICE OF A HARD DISK DRIVE BAY

BACKGROUND OF THE INVENTION

1. Field of the Invention

The present invention relates to an alignment device of a hard disk drive (HDD) bay, especially to an alignment device of a HDD bay that can push a HDD to a predetermined position when the HDD is inserted into the HDD bay.

2. Description of the Prior Art(s)

A hard disk drive (HDD) is a dominant data storage device in a general-purpose computer. A removable HDD bay for receiving the HDD is designed for the convenience of drawing the HDD from a computer case without open the computer case.

With reference to FIG. 5, a conventional HDD bay comprises a casing 61, a door 62, a swing lever 63, a transmission lever 64, and a connector 65. The casing 61 has a front opening and a mounting chamber 611. The mounting chamber 611 is formed in the casing 61 and is used for receiving an HDD 66. The door 62 is pivotally mounted in the front opening of the casing 61. The swing lever 63 is pivotally mounted on a rear end of the casing 61. The transmission lever 64 is pivotally connected to the door 62 and the swing lever 63. The connector 65 is mounted on the rear end of the casing 61 and is electrically connected to a circuit board. When the HDD 66 is inserted in the mounting chamber 611 of the casing 61, pins on a rear end of the HDD 66 correspondingly plug into the connector 65. When opening the door 63, the door 63 drives the swing lever 63 via the transmission lever 64 to pivot toward the front opening of the casing 61, and the swing lever 63 abuts against and pushes the rear end of the HDD 66. Thus, the pins of the HDD 66 are unplugged from the connector 65 and then the HDD 66 is pushed out of the casing 61.

Generally, a thickness and a width of the mounting chamber 611 of the casing 61 are slightly larger than a thickness and a width of the HDD 66 for the convenience of inserting the HDD into the mounting chamber 611. However, the HDDs differ in thickness and width. When inserting the HDD 66 with small thickness and width into the mounting chamber 611, the HDD 66 may slide laterally, causing the pins on the rear end of the HDD 66 unable to plug into corresponding holes on the connector 65. Accordingly, under constant plugging and unplugging, the pins of the HDD 66 may wear down and loose contact could be resulted. Data storage function and data processing function of the HDD 66 are greatly influenced.

To overcome the shortcomings, the present invention provides an alignment device of a HDD bay to mitigate or obviate the aforementioned problems.

SUMMARY OF THE INVENTION

The main objective of the present invention is to provide an alignment device of a hard disk drive (HDD) bay. The alignment device has a casing, at least one door, and at least one alignment mechanism. The at least one door is pivotally mounted on a front sidewall of the casing. The at least one alignment mechanism is mounted on a rear sidewall of the casing. Each of the at least one alignment mechanism has a stationary seat, and an aligning panel and a torsion spring pivotally mounted on the stationary seat. The torsion spring pushes the aligning panel to pivot toward one of two lateral sidewalls of the casing.

When inserting an HDD into the casing and the HDD abuts against the aligning panel, the aligning panel pushes the HDD to slide laterally and align with the connector on the rear sidewall of the casing. Thus, pins on a rear end of the HDD can accurately plug into corresponding holes of the connector.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
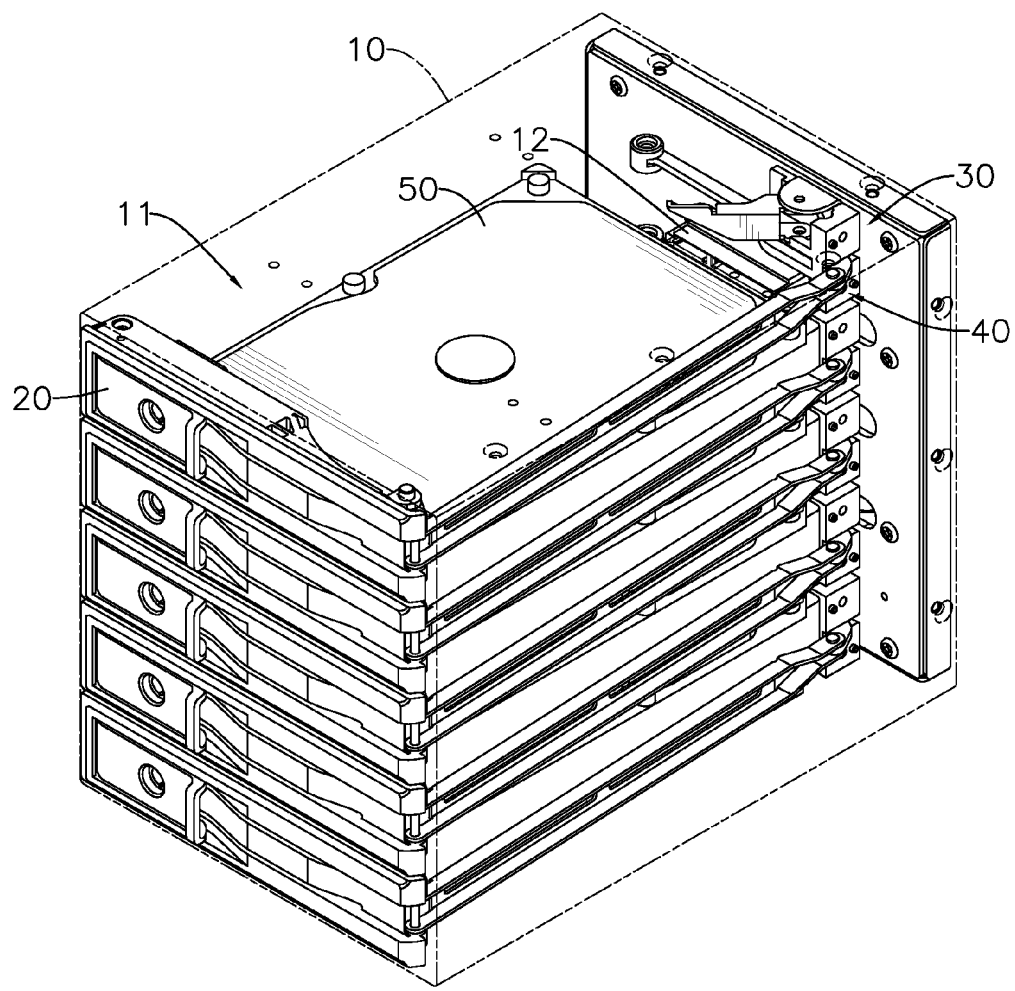
FIG. 1 is a perspective view of an alignment device of a hard disk (HDD) drive bay in accordance with the present invention.

With reference to FIG. 1, an alignment device of a hard disk drive (HDD) bay in accordance with the present invention comprises a casing 10, at least one connector 12, at least one door 20, at least one alignment mechanism 30, and at least one extracting mechanism 40.

The casing 10 has a front sidewall, a rear sidewall, two opposite lateral sidewalls, at least one mounting chamber 11, and at least one insertion opening. The at least one mounting chamber 11 is formed inside the casing 10. The at least one insertion opening is formed through the front sidewall of the casing 10, and respectively corresponds in position to and communicates with the at least one mounting chamber 11. The at least one connector 12 is mounted on the rear sidewall of the casing 10, and is respectively mounted in and corresponds in positioning to the at least one mounting chamber 11. At least one HDD 50 is inserted into the at least one mounting chamber 11 through the at least one insertion opening of the casing 10.

Figure 4:
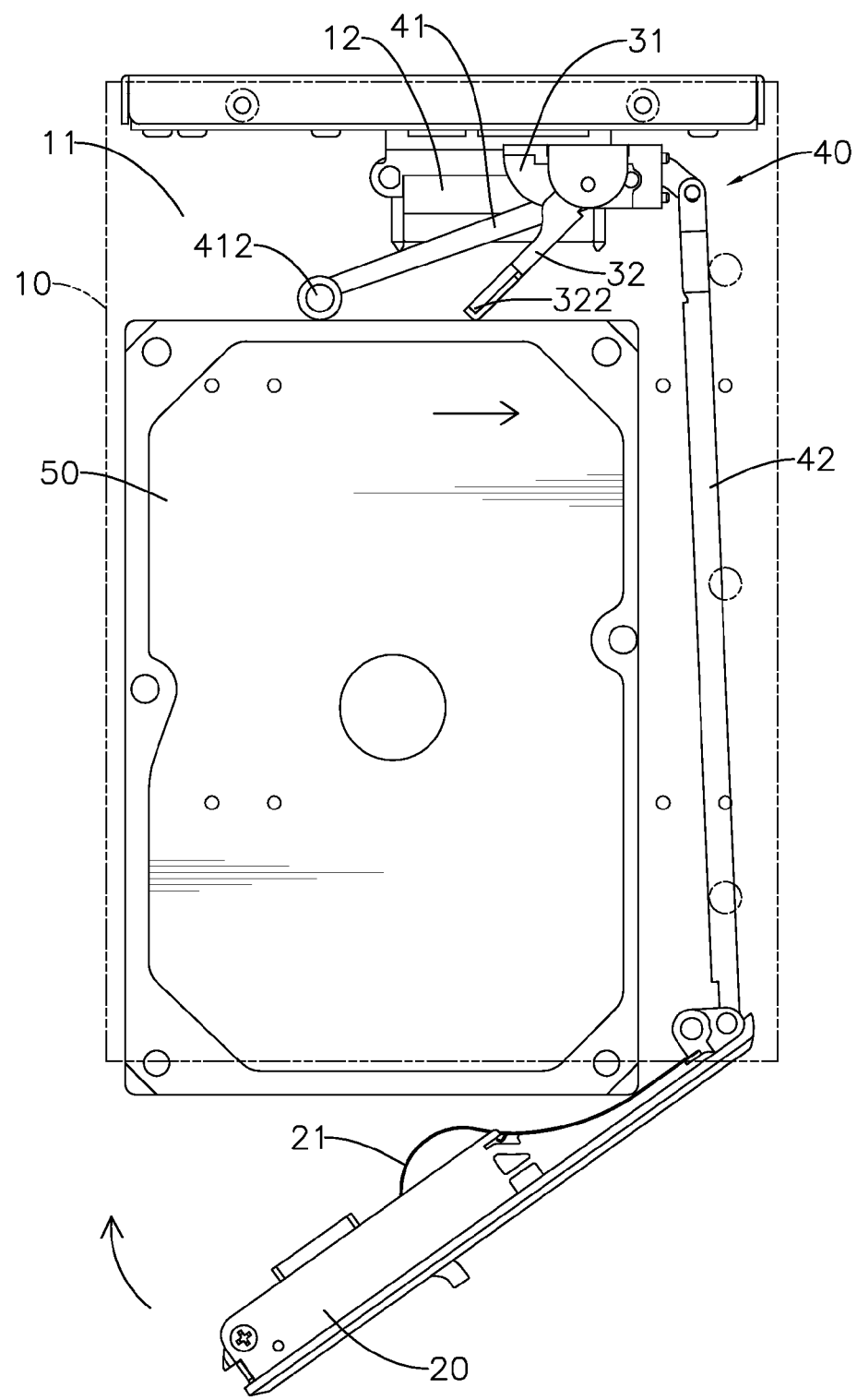
FIG. 4 is an operational top view of the alignment device of the HDD bay in FIG. 1.
Figure 5:
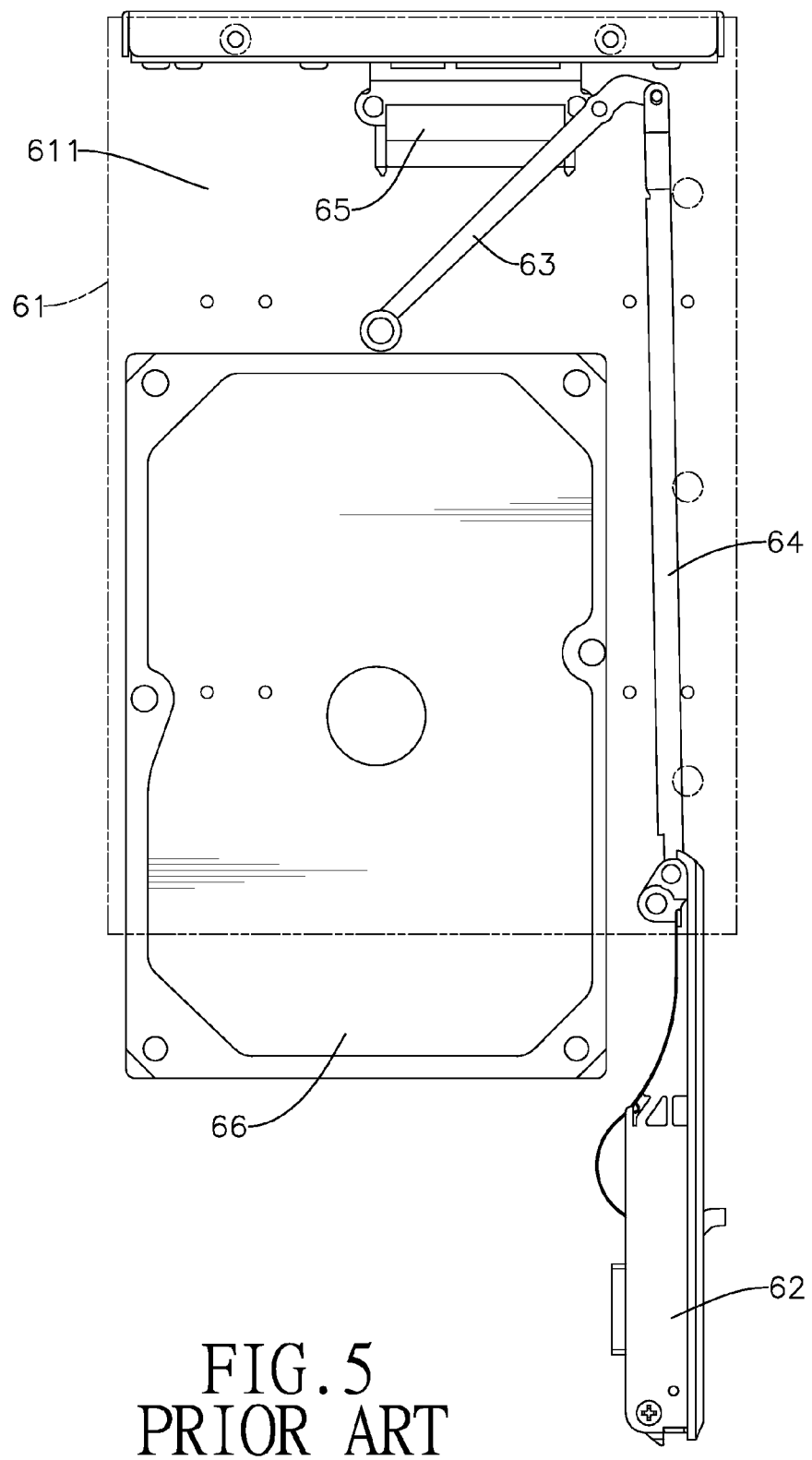
FIG. 5 is an operational top view of a conventional hard disk HDD bay in accordance with the prior art.

With further reference to FIG. 4, the at least one door 20 is respectively mounted pivotally in the at least one insertion opening of the casing 10. Each of the at least one door 20 has an inner surface and a resilient element 21. The inner surface of the door 20 faces a corresponding one of the at least one insertion opening of the casing 10. The resilient element 21 is mounted on the inner surface of the door 20. When the door 20 is closed and covers the corresponding one of the at least one insertion opening of the casing 10, the resilient element 21 abuts against the HDD 50 and is compressed. Thus, the resilient element 21 pushes the door 20 to tent to open relative to the casing 10.

Figure 2:
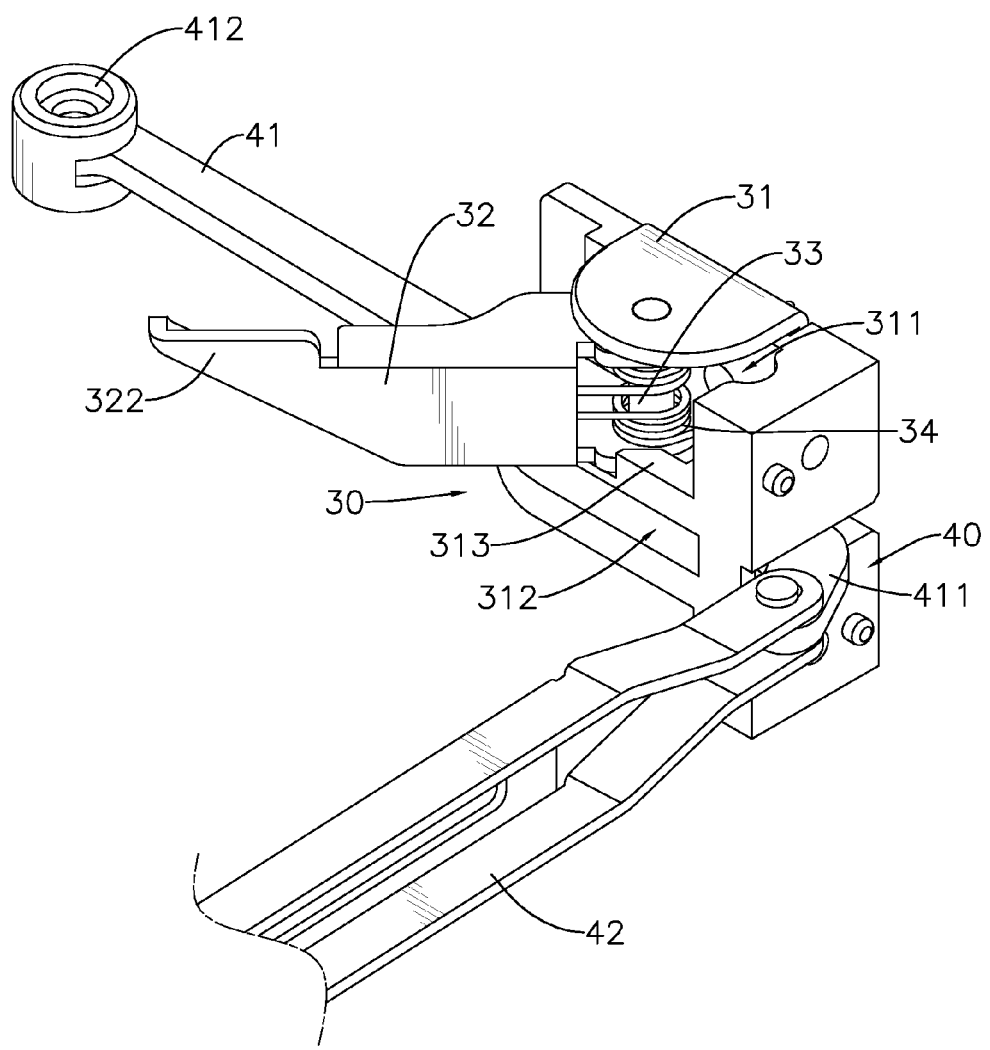
FIG. 2 is an enlarged perspective view of the alignment device of the HDD bay in FIG. 1.
Figure 3:
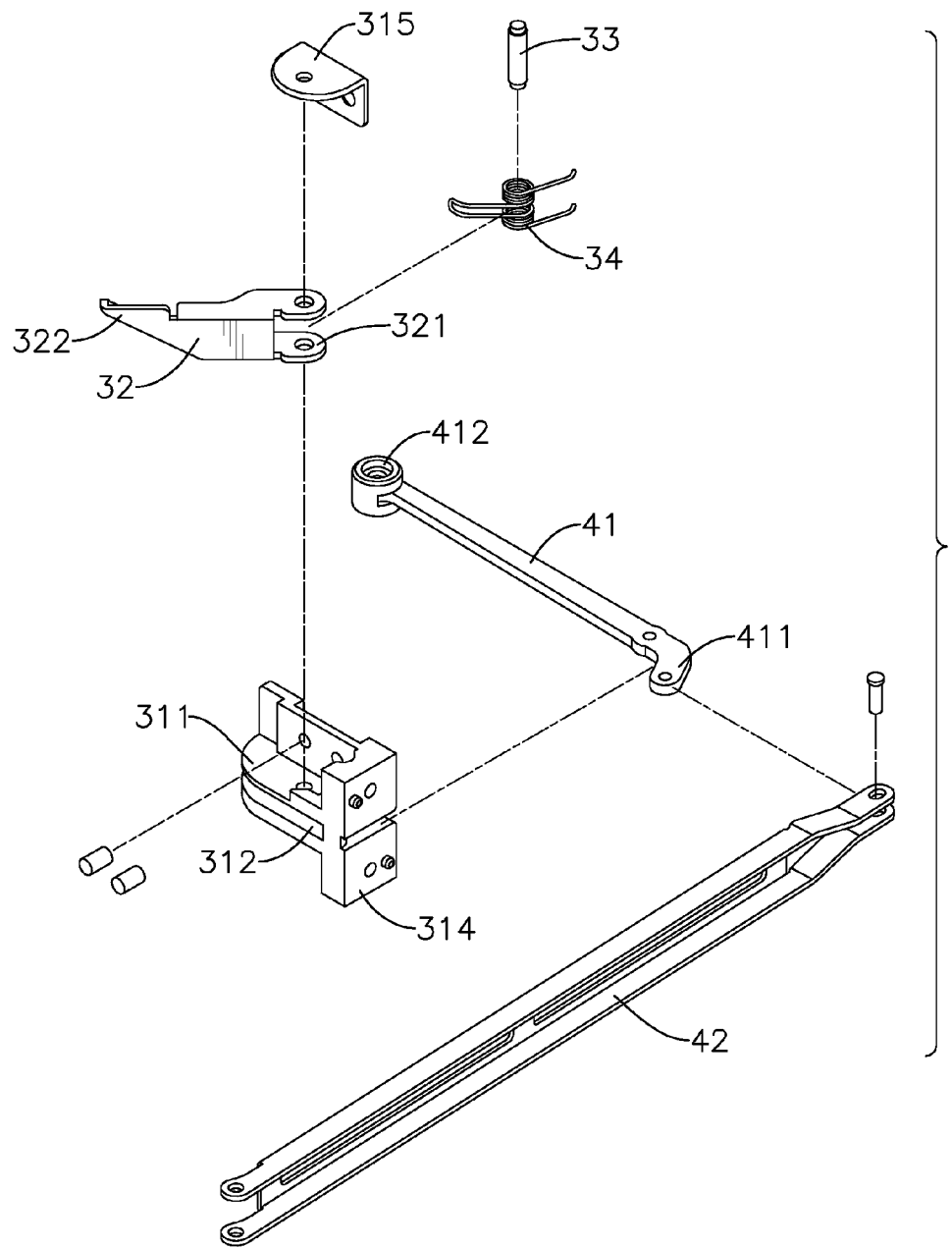
FIG. 3 is an exploded perspective view of the alignment device of the HDD bay in FIG. 1.

With further reference to FIGS. 2 and 3, the at least one alignment mechanism 30 is mounted on the rear sidewall of the casing 10, and are respectively mounted in and corresponds in position to the at least one mounting chamber 11. Each of the at least one alignment mechanism 30 has a stationary seat 31, an aligning panel 32, and a torsion spring 33.

The stationary seat 31 is securely mounted on the rear sidewall of the casing 10 and has a first pivot recess 311, a second pivot recess 312, and a limiting protrusion 313. The first pivot recess 311 and the second pivot recess 312 are arranged in an up-down manner. The limiting protrusion 313 is formed in the first recess 311.

The aligning panel 32 has a pivoting end 321 and a pushing end 322. The pivoting end 321 of the aligning panel 32 is pivotally mounted in the first pivot recess 311 of the stationary seat 31 via a shaft 33. The pushing end 322 of the aligning panel 32 obliquely protrudes into a corresponding one of the at least one mounting recess 11. The torsion spring 33 is mounted around the shaft 33 and has two ends respectively abutting against the stationary seat 31 and the aligning panel 32. The torsion spring 33 pushes the aligning panel 32 to pivot toward one of the lateral sidewalls of the casing 10. The limiting protrusion 313 of the stationary seat 31 limits a pivoting angle of the aligning panel 32.

The at least one extracting mechanism 40 is driven by the door 20. Each of the at least one extracting mechanism 40 has a swing lever 41 and a transmission lever 42. The swing lever 41 is pivotally mounted in the second pivot recess 312 of the stationary seat 31 of a corresponding one of the at least one alignment mechanism 30, and has a pivoting end 411 and a pushing end 412. The transmission lever 42 has two ends respectively connected pivotally to the door 20 and the pivoting end 411 of the swing lever 41. When the door 20 pivots to open or close relative to the corresponding one of the at least one insertion opening of the casing 10, the door 20 drives the swing lever 41 via the transmission lever 42 to pivot forwardly to obliquely protrude into a corresponding one of the at least one mounting recess 11, or to pivot backwardly to become parallel to the rear sidewall of the casing 10.

In the preferred embodiment, the stationary seat 31 of each of the at least one alignment mechanism 30 is formed by attaching a base 314 and a holding panel 315. The first pivot recess 311 of the stationary seat 31 is formed in a top surface of the base 314 and through a side surface of the base 314. The second pivot recess 312 of the stationary seat 31 is formed below the first pivot recess 311 of the stationary seat 31. When assembling the alignment mechanism 30, the torsion spring 34 and the pivoting end 321 of the aligning panel 32 are mounted on the shaft 33 first. Then the torsion spring 34, the pivoting end 321 of the aligning panel 32, and the shaft 33 are mounted into the first pivot recess 311 of the base 314 together. The holding panel 315 is mounted on the top surface of the base 314. Two ends of the shaft 33 are respectively connected to the base 314 and the holding panel 315. Thus, the torsion spring 34 and the aligning panel 32 can be pivotally mounted in the first pivot recess 311.

As shown in FIG. 4, when the HDD 50 is inserted into the corresponding one of the at least one mounting recess 11 and the door 20 is closing, the resilient element 21 on the inner surface of the door 20 pushes the HDD 50 to slide forward into the mounting recess 11. As a rear end of the HDD 50 abuts against the pushing end 322 of the aligning panel 32, the torsion spring 34 resilient pushes the aligning panel 32, such that the pushing end 322 of the aligning panel 32 pushes the HDD 50 to slide laterally. Thus, the HDD 50 can slide to align with the connector 12 that is disposed on the rear sidewall of the casing 10, and pins on the rear end of the HDD 50 can accurately plug into corresponding holes of the connector 12.

Meanwhile, when closing the door 20, the door 20 also drives the swing lever 41 via the transmission lever 42 to pivot backwardly to be stored on the rear sidewall of the casing 10. Afterwards, when opening the door 20, the swinging lever 41 is driven to push the HDD 50 with the pushing end 412 of the swing lever 41. Accordingly, the pins of the HDD 50 can be unplugged from the connector 12 and the HDD 50 can be pushed out of the mounting recess 11 of the casing 10.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An alignment device of a hard disk drive (HDD) bay comprising:
   a casing having
      at least one mounting chamber formed inside the casing; and
      at least one insertion opening formed through a front sidewall of the casing, and respectively corresponding in position to and communicating with the at least one mounting chamber;
   at least one door respectively mounted pivotally in the at least one insertion opening of the casing; and
   at least one alignment mechanism mounted on a rear sidewall of the casing, and respectively mounted in and corresponding in position to the at least one mounting chamber, each of the at least one alignment mechanism having
      a stationary seat securely mounted on the rear sidewall of the casing and having
         a first pivot recess; and
         a limiting protrusion formed in the first recess;
      an aligning panel having
         a pivoting end pivotally mounted in the first pivot recess of the stationary seat via a shaft; and
         a pushing end obliquely protruding into a corresponding one of the at least one mounting recess; and
      a torsion spring mounted around the shaft and having two ends respectively abutting against the stationary seat and the aligning panel;
   wherein the torsion spring pushes the aligning panel to pivot toward one of two lateral sidewalls of the casing; and
   the limiting protrusion of the stationary seat limits a pivoting angle of the aligning panel.

2. The alignment device as claimed in claim 1, wherein
   each of the at least one alignment mechanism further has a second pivot recess; and
   the alignment device further comprises at least one extracting mechanism, each of the at least one extracting mechanism has
      a swing lever pivotally mounted in the second pivot recess of the stationary seat of a corresponding one of the at least one alignment mechanism, the swing lever having a pivoting end and a pushing end; and
      a transmission lever having two ends respectively connected pivotally to the door and the pivoting end of the swing lever.

3. The alignment device as claimed in claim 1 further comprising at least one connector mounted on the rear sidewall of the casing, and respectively mounted in and corresponding in positioning to the at least one mounting chamber.

4. The alignment device as claimed in claim 2 further comprising at least one connector mounted on the rear sidewall of the casing, and respectively mounted in and corresponding in positioning to the at least one mounting chamber.

5. The alignment device as claimed in claim 1, wherein
the stationary seat of each of the at least one alignment mechanism is formed by attaching a base and a holding panel;
the first pivot recess of the stationary seat is formed in a top surface of the base and through a side surface of the base;
the holding panel is mounted on the top surface of the base; and
two ends of the shaft are respectively connected to the base and the holding panel.

6. The alignment device as claimed in claim 2, wherein
the stationary seat of each of the at least one alignment mechanism is formed by attaching a base and a holding panel;
the first pivot recess of the stationary seat is formed in a top surface of the base and through a side surface of the base;
the holding panel is mounted on the top surface of the base; and
two ends of the shaft are respectively connected to the base and the holding panel.

7. The alignment device as claimed in claim 3, wherein
the stationary seat of each of the at least one alignment mechanism is formed by attaching a base and a holding panel;
the first pivot recess of the stationary seat is formed in a top surface of the base and through a side surface of the base;
the holding panel is mounted on the top surface of the base; and
two ends of the shaft are respectively connected to the base and the holding panel.

8. The alignment device as claimed in claim 4, wherein
the stationary seat of each of the at least one alignment mechanism is formed by attaching a base and a holding panel;
the first pivot recess of the stationary seat is formed in a top surface of the base and through a side surface of the base;
the holding panel is mounted on the top surface of the base; and
two ends of the shaft are respectively connected to the base and the holding panel.

\* \* \* \* \*